(12) United States Patent
Nguyen et al.

(10) Patent No.: US 11,749,705 B2
(45) Date of Patent: Sep. 5, 2023

(54) SIMULTANEOUS DUAL-BAND IMAGE SENSORS

(71) Applicant: HRL Laboratories, LLC, Malibu, CA (US)

(72) Inventors: Minh B. Nguyen, Thousand Oaks, CA (US); Brett Z. Nosho, Santa Monica, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 17/583,098

(22) Filed: Jan. 24, 2022

(65) Prior Publication Data

US 2022/0149107 A1    May 12, 2022

Related U.S. Application Data

(62) Division of application No. 16/776,907, filed on Jan. 30, 2020, now Pat. No. 11,282,887.

(60) Provisional application No. 62/832,693, filed on Apr. 11, 2019.

(51) Int. Cl.
*H01L 27/146*    (2006.01)
*H01L 27/02*     (2006.01)

(52) U.S. Cl.
CPC .... *H01L 27/14667* (2013.01); *H01L 27/0285* (2013.01); *H01L 27/14609* (2013.01)

(58) Field of Classification Search
CPC .......... H01L 27/14667; H01L 27/0285; H01L 27/14609; H01L 27/14647; H01L 27/14649; H01L 27/14683
See application file for complete search history.

(56) References Cited

U.S. PATENT DOCUMENTS

| | | |
|---|---|---|
| 5,239,179 A | 8/1993 | Baker |
| 5,559,336 A | 9/1996 | Kosai et al. |
| 5,581,084 A * | 12/1996 | Chapman ............ H01L 31/1032 250/370.06 |
| 5,959,339 A * | 9/1999 | Chapman .......... H01L 27/14649 257/466 |
| 6,034,407 A | 3/2000 | Tennant et al. |

(Continued)

OTHER PUBLICATIONS

Rogalski, "Infrared Detectors for the Future", Acta Physica Polonica A, pp. 389-406, vol. 116, No. 3, 2009.
International Search Report issued with respect to International Application No. PCT/US2020/015886 dated May 25, 2020.
Written Opinion of the ISA issued with respect to International Application No. PCT/US2020/015886 dated May 25, 2020.
(Continued)

*Primary Examiner* — Samuel Park
(74) *Attorney, Agent, or Firm* — Ladas & Parry, LLP

(57) ABSTRACT

A simultaneous dual-band image sensor having a plurality of pixels includes a substrate, a common ground on the substrate, wherein each pixel includes a Band 1 absorber layer on the common ground layer, a barrier layer on the Band 1 absorber layer, a Band 2 absorber layer on the barrier layer, a ring opening in the pixel formed by a removed portion of the Band 2 absorber layer, a removed portion of the barrier layer and a removed portion of the Band 1 absorber layer, wherein the ring opening does not extend through the Band 1 absorber layer, a first contact on a portion of the Band 2 absorber layer inside the ring, and a second contact on a portion of the Band 2 absorber layer outside the ring. The Band 1 absorber layer and the Band 2 absorber layer are n-type, or the Band 1 absorber layer and the Band 2 absorber layer are p-type.

11 Claims, 8 Drawing Sheets

(56) References Cited

U.S. PATENT DOCUMENTS

| | | | |
|---|---|---|---|
| 6,091,126 | A | 7/2000 | Costard et al. |
| 6,376,826 | B1 | 4/2002 | Baney et al. |
| 7,129,489 | B2* | 10/2006 | Pham .................. H01L 27/1465 |
| | | | 257/E27.137 |
| 9,490,292 | B1* | 11/2016 | Yap ................... H01L 27/14625 |
| 2005/0045910 | A1* | 3/2005 | Taylor ................. H01L 31/1035 |
| | | | 257/E31.058 |
| 2009/0256231 | A1 | 10/2009 | Klipstein |
| 2011/0073762 | A1* | 3/2011 | Soma ................ H01L 27/14649 |
| | | | 250/338.4 |
| 2013/0076910 | A1 | 3/2013 | Scott |
| 2014/0225216 | A1 | 8/2014 | Kawakami et al. |
| 2014/0264705 | A1 | 9/2014 | Ozaki |
| 2015/0243825 | A1* | 8/2015 | Keasler ........... H01L 31/035281 |
| | | | 257/184 |
| 2018/0294309 | A1* | 10/2018 | Wei ................. H01L 31/035236 |

OTHER PUBLICATIONS

International Preliminary Report on Patentability from PCT/US2020/015886, dated Sep. 28, 2021.

Office Action and attachments from U.S. Appl. No. 16/776,907, dated Jan. 22, 2021.

Office Action and attachments from U.S. Appl. No. 16/776,907, dated Mar. 11, 2021.

Office Action and attachments from U.S. Appl. No. 16/776,907, dated May 17, 2021.

Office Action and attachments from U.S. Appl. No. 16/776,907, dated Aug. 3, 2021.

Office Action and attachments from U.S. Appl. No. 16/776,907, dated Aug. 13, 2021.

Notice of Allowance and attachments from U.S. Appl. No. 16/776,907, dated Nov. 9, 2021.

Extended Supplementary Search Report from European Patent Application No. 20788039.4 dated Jan. 10, 2023.

* cited by examiner

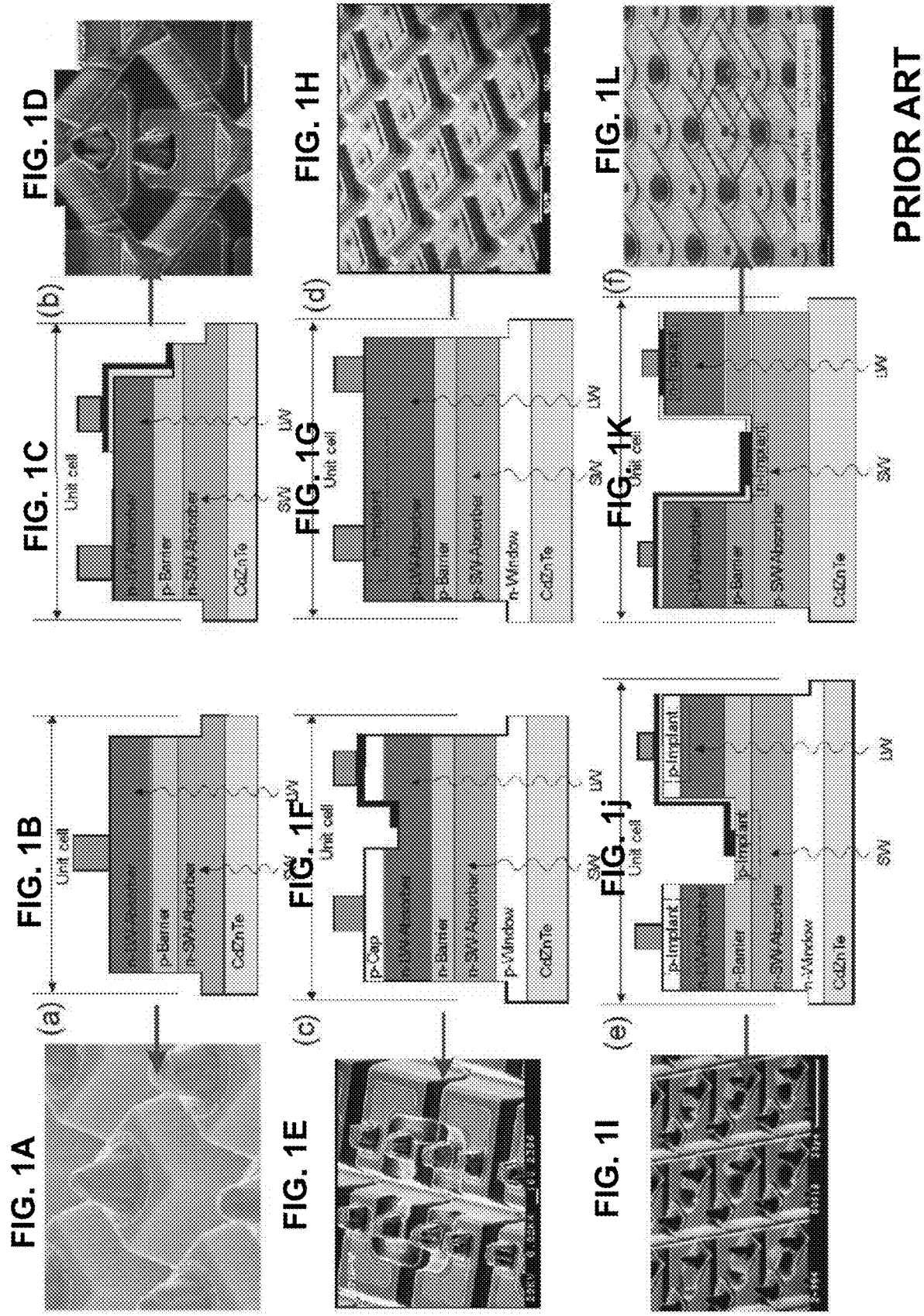
PRIOR ART

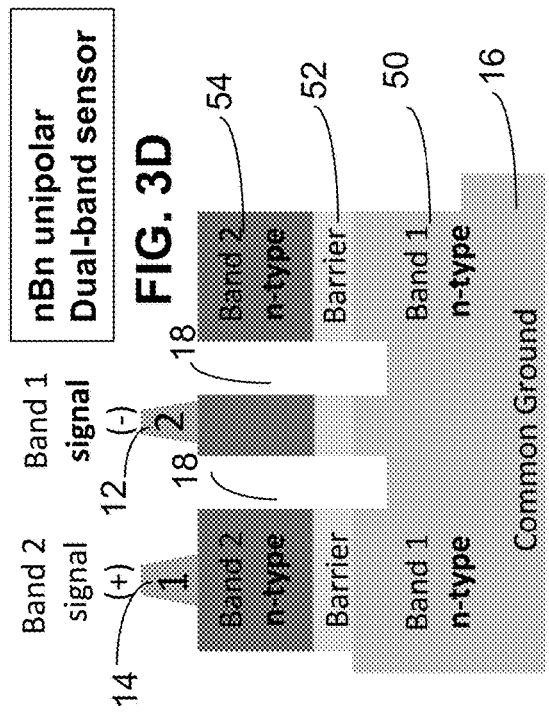
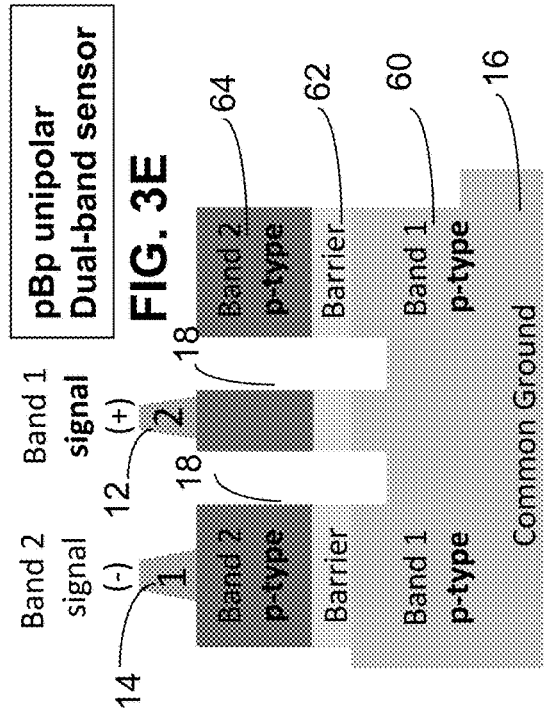
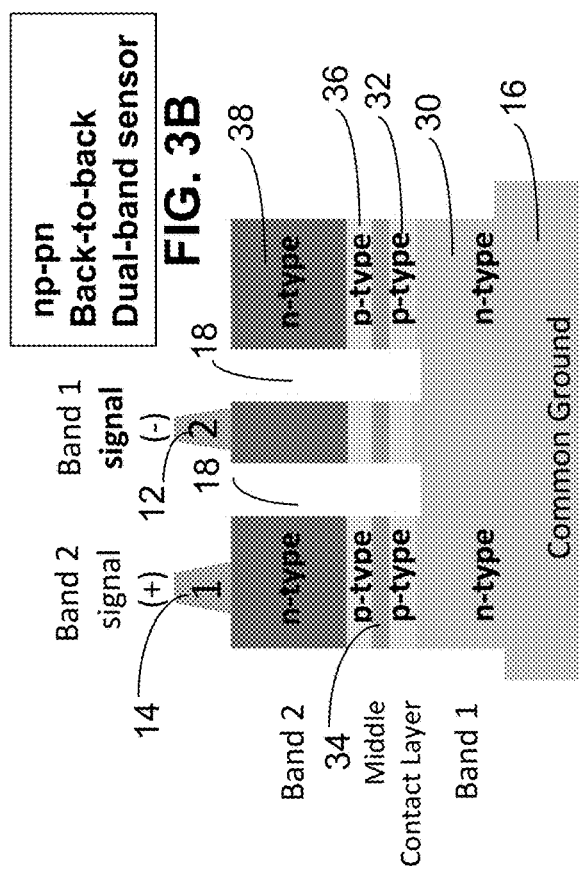
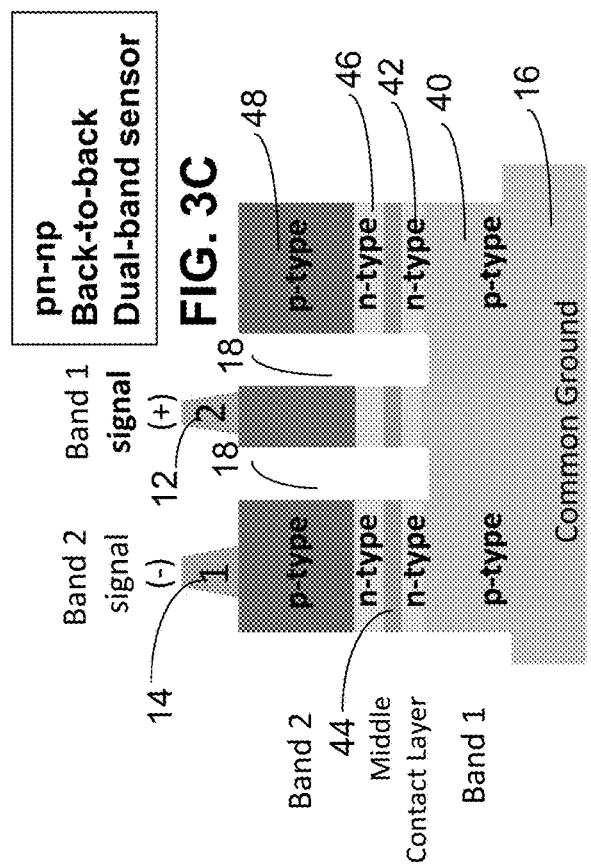

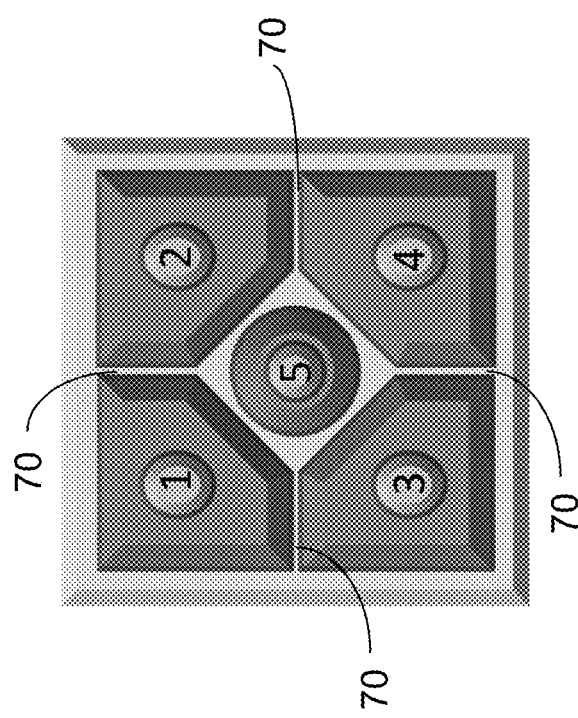
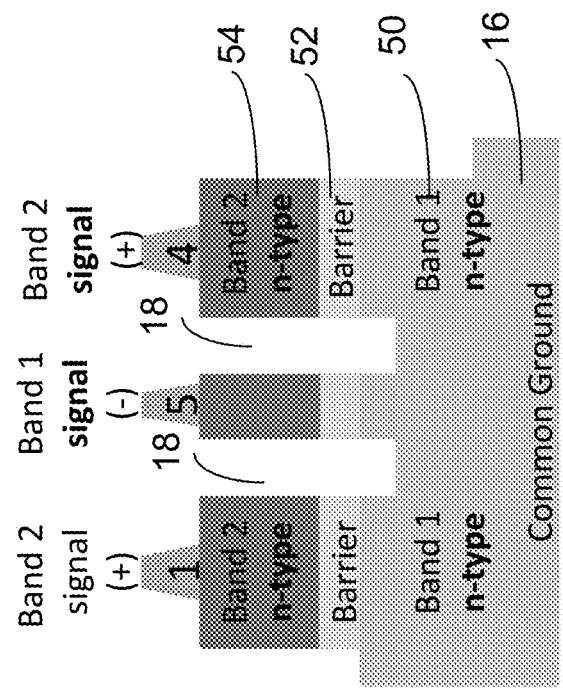
FIG. 5A
FIG. 5B

SIMULTANEOUS DUAL-BAND IMAGE SENSORS

CROSS-REFERENCE TO RELATED APPLICATIONS

This application is a divisional application of U.S. application Ser. No. 16/776,907, filed on Jan. 30, 2020, which is related to and claims priority from U.S. Provisional Application Ser. No. 62/832,693, filed on Apr. 11, 2019, which are incorporated herein by reference as though set forth in full.

STATEMENT REGARDING FEDERAL FUNDING

None

TECHNICAL FIELD

This disclosure relates to dual-band and two-color image sensors.

BACKGROUND

Some prior art dual-band sensors operate in a sequential mode with one band sensed and then another band sensed, which results in a blind moment for each band when the other band is being sensed. Other prior art dual band sensors operate in a simultaneous mode; however, their fabrication process is complicated, has low yield and is difficult to scale up for reduced pitch size, or increased format size. Most of the prior art approaches need either a diffusion/implantation step or a metal bridge from a middle layer to a top layer. Both these steps add complexity in the fabrication process. Further, none of prior art claims to work for unipolar two-color designs (nBn or pBp) with thin barrier layers. Unipolar detector designs have shown many advantages over traditional photodiode detectors and in recent years are preferred for single-color and sequential mode two-color image sensors.

Generally, image sensors need to be connected to a separate signal processing component. A hybridization bump or interconnect approach has been used to form electrical connection, so that each sensing element (pixel) mates to a signal processing counterpart. The bump may be an indium (In) bump, and the interconnect approach may be a metal interconnect.

For single-color sensors, or two-color sensors operating in a bias-selectable sequential mode, there is usually one bump per pixel. For two-color sensors operating in a simultaneous mode, two or three bumps are required per pixel, making the fabrication very challenging. Prior art for two-color sensors are described in "Infrared Detectors for the Future" by A. Rogalski, Acta Physica Polonica A pp 389, Vol 116, No 3, (2009), which is incorporated herein by reference. FIGS. 1A, 1B, 1C, 1D, 1E, 1F, 1G, 1H, 1I, 1J, 1K, and 1L, which are the same as shown in FIG. 7 of the Rogalski reference, show images and cross-section views of prior art unit cells for various back-illuminated dual-band HgCdTe detector image sensors: FIGS. 1A and 1B a bias selectable n-p-n structure, FIGS. 1C and 1D a simultaneous n-p-n design, FIGS. 1E and 1F a simultaneous p-n-n-p, FIGS. 1G and 1H a simultaneous n-p-p-p-n design, FIGS. 1I and 1J a simultaneous structure based on p-on-n junctions, and FIGS. 1K and 1L a simultaneous structure based on n-on-p junctions.

The prior art requires either a contact made in a middle layer and an electrical connection bridging from the middle layer to the top layer, or a dopant implantation step. These process can be complicated and hamper the ability to scale up simultaneous 2 color sensor arrays.

What is needed is an improved simultaneous dual-band image sensor, which has a simpler and higher yielding fabrication process. The embodiments of the present disclosure answer these and other needs.

SUMMARY

In a first embodiment disclosed herein, a method of providing a simultaneous dual-band image sensor having a plurality of pixels comprises providing a substrate, forming a common ground on the substrate, forming a Band 1 absorber layer on the common ground layer, forming a barrier layer on the Band 1 absorber layer, forming a Band 2 absorber layer on the barrier layer, reticulating each pixel by etching the Band 2 absorber layer, the barrier layer and the Band 1 absorber layer on sides of each pixel to but not through the common ground layer, etching a ring through the Band 2 absorber layer, and the barrier layer and into the Band 1 absorber layer but not through the Band 1 absorber layer, forming a first contact on a portion of the Band 2 absorber layer inside the ring, and forming a second contact on a portion of the Band 2 absorber layer outside the ring, wherein the Band 1 absorber layer is n-type and the Band 2 absorber layer is n-type, or wherein the Band 1 absorber layer is p-type and the Band 2 absorber layer is p-type.

In another embodiment disclosed herein, a simultaneous dual-band image sensor having a plurality of pixels comprises a substrate, a common ground on the substrate, wherein each pixel comprises a Band 1 absorber layer on the common ground layer, a barrier layer on the Band 1 absorber layer, a Band 2 absorber layer on the barrier layer, a ring opening in the pixel formed by a removed portion of the Band 2 absorber layer, a removed portion of the barrier layer and a removed portion of the Band 1 absorber layer, wherein the ring opening does not extend through the Band 1 absorber layer, a first contact on a portion of the Band 2 absorber layer inside the ring, and a second contact on a portion of the Band 2 absorber layer outside the ring, wherein the Band 1 absorber layer is n-type and the Band 2 absorber layer is n-type, or wherein the Band 1 absorber layer is p-type and the Band 2 absorber layer is p-type.

In yet another embodiment disclosed herein, a method of providing a simultaneous dual-band image sensor having a plurality of pixels comprises providing a substrate, forming a common ground on the substrate, forming a Band 1 diode layer on the common ground layer, forming a middle contact layer on the Band 1 diode layer, forming a Band 2 diode layer on the middle contact layer, reticulating each pixel by etching the Band 2 diode layer, the middle contact layer and the Band 1 diode layer on sides of each pixel to but not through the common ground layer, etching a ring through the Band 2 diode layer, and the middle contact layer and into the Band 1 diode layer but not through the Band 1 diode layer, forming a first contact on a portion of the Band 2 diode layer inside the ring, and forming a second contact on a portion of the Band 2 diode layer outside the ring, wherein the Band 1 diode layer comprises a first n-type layer on the common ground layer and a first p-type layer on the first n-type layer, the Band 2 diode layer comprises a second p-type layer on the middle contact layer and a second n-type layer on the second p-type layer, and wherein forming a first contact on a portion of the Band 2 diode layer inside the ring and forming a second contact on a portion of the Band 2 diode layer outside the ring comprises forming the first contact and the second contact on the second n-type layer, or wherein the Band 1 diode layer comprises a first p-type layer on the common ground layer and a first n-type layer on the first p-type layer, the Band 2 diode layer comprises a second n-type layer on the middle contact layer and a second p-type layer on the second n-type layer, and wherein forming a first contact on a portion of the Band 2 diode layer inside the ring and forming a second contact on a portion of the Band 2 diode layer outside the ring comprises forming the first contact and the second contact on the second p-type layer.

In still yet another embodiment disclosed herein, simultaneous dual-band image sensor having a plurality of pixels comprises a substrate, a common ground on the substrate, wherein each pixel comprises a Band 1 diode layer on the common ground layer, a middle contact layer on the Band 1 diode layer, a Band 2 diode layer on the middle contact layer, a ring opening in the pixel formed by a removed portion of the Band 2 diode layer, a removed portion of the middle contact layer and a removed portion of the Band 1 diode layer, wherein the ring opening does not extend through the Band 1 diode layer, a first contact on a portion of the Band 2 diode layer inside the ring, and a second contact on a portion of the Band 2 diode layer outside the ring, wherein the Band 1 diode layer comprises a first n-type layer on the common ground layer and a first p-type layer on the first n-type layer, the Band 2 diode layer comprises a second p-type layer on the middle contact layer and a second n-type layer on the second p-type layer, and wherein the first contact and the second contact are on the second n-type layer, or wherein the Band 1 diode layer comprises a first p-type layer on the common ground layer and a first n-type layer on the first p-type layer, the Band 2 diode layer comprises a second n-type layer on the middle contact layer and a second p-type layer on the second n-type layer, and wherein the first contact and the second contact are on the second p-type layer.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 1A, 1B, 1C, 1D, 1E, 1F, 1G, 1H, 1I, 1J, 1K and 1L show images and cross-section views of unit cells for various back-illuminated dual-band HgCdTe detector image sensors: FIGS. 1A and 1B show a bias selectable n-p-n structure, FIGS. 1C and 1D show a simultaneous n-p-n design, FIGS. 1E and 1F show a simultaneous p-n-n-p, FIGS. 1G and 1H show a simultaneous n-p-p-p-n design, FIGS. 1I and 1J show a simultaneous structure based on p-on-n junctions, and FIGS. 1K and 1L show a simultaneous structure based on n-on-p junctions in accordance with the prior art.

FIGS. 3C, 3D, 3E and 3F show side views of different configurations that may be used for the simultaneous two-color image sensor detector pixel of FIG. 3A. FIG. 3B shows an np-pn back-to-back dual-band image sensor, FIG. 3C shows a pn-np back-to-back dual-band image sensor, FIG. 3D shows an n-Barrier-n unipolar dual-band image sensor, and FIG. 3E shows a p-Barrier-p unipolar dual-band image sensor in accordance with the present disclosure.

FIGS. 5A and 5B show a top view and a side view schematic diagram of a simultaneous two-color image sensor detector with a configuration of one pixel for Band 1 and 4 sub-pixels for Band 2. FIG. 5B shows a sectional side view using the unipolar architecture of FIG. 3D, however, the other architectures shown in FIGS. 3B, 3C and 3E may also be used in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes an image sensor device architecture that enables fabrication of scalable simultaneous dual-band image sensors with high yield. Specifically, the invention of the present disclosure allows for simultaneous collection of signals from two electromagnetic bands registered on the same pixel. This can be applied for a combination of any two electromagnetic spectral bands, such as infrared, visible or ultra violet (UV). Compared to existing simultaneous two-color technologies, the invention of the present disclosure has a simpler fabrication process and higher yields, which allows scaling to larger image sensor sizes.

Figure 2B:
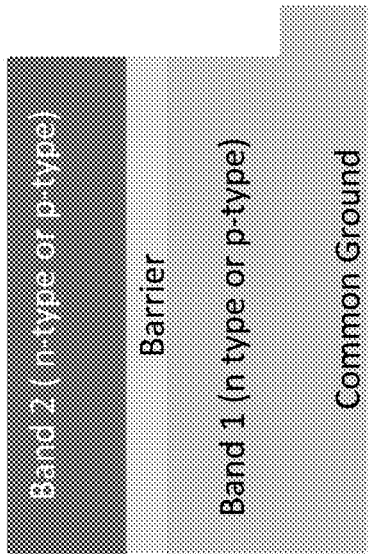
FIG. 2B shows a representative structure layout for a prior art unipolar (nBn, pBp) architecture.
Figure 2A:
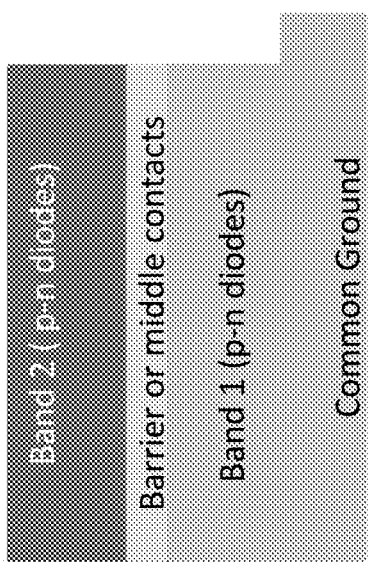
FIG. 2A shows a representative structure layout for a prior art back-to-back diode architecture.

The present disclosure describes an image sensor architecture that is compatible with both back-to-back diode architectures and unipolar (nBn, pBp) architectures. FIG. 2A shows a representative structure layout for a prior art back-to-back diode architecture, which may require a middle contact, as shown. FIG. 2B shows a representative structure layout for a prior art unipolar (nBn, pBp) architecture.

Figure 3A:
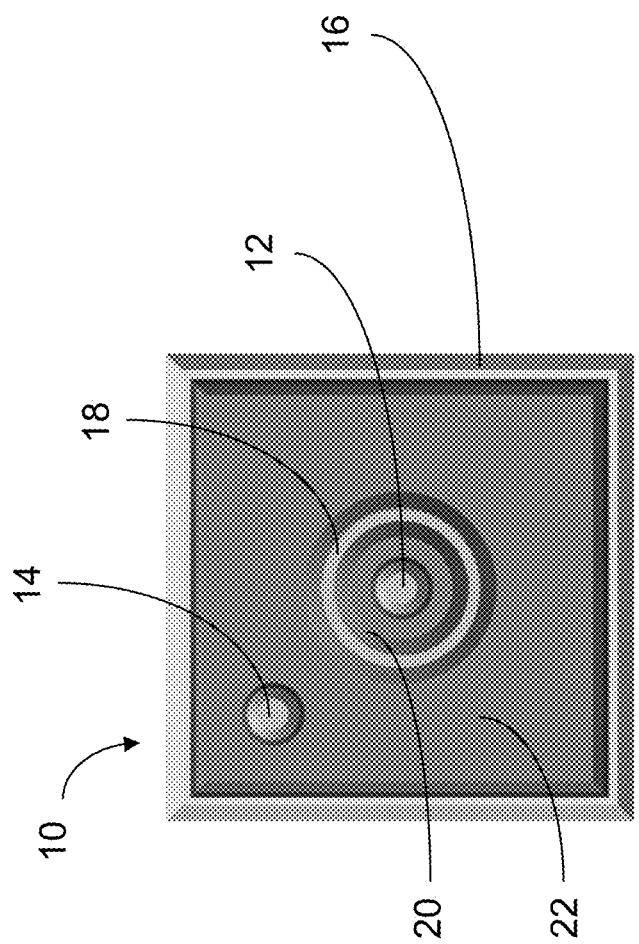
FIG. 3A shows a top view of a simultaneous two-color image sensor detector pixel in a two bump configuration in accordance with the present disclosure.

FIG. 3A shows a top view of a simultaneous two-color image sensor detector pixel 10 with in a two bump configuration in accordance with the present disclosure. The pixel has a bump 12 for a Band 1, and a bump 14 for a Band 2. On the edge of the pixel is a common ground 16. A ring 18 in the pixel separates the pixel into portion 20 inside the ring and portion 22 outside the ring. The ring is shown as circular, but can also be rectangular or polygonal in shape.

FIGS. 3B, 3C, 3D and 3E show side views of different configurations that may be used for the simultaneous two-color image sensor detector pixel of FIG. 3A.

FIG. 3B shows a np-pn back-to-back dual-band image sensor, FIG. 3C shows a pn-np back-to-back dual-band image sensor, FIG. 3D shown a n-Barrier-n unipolar dual-band image sensor, and FIG. 3E shows a p-Barrier-p unipolar dual-band image sensor.

Figure 6A:
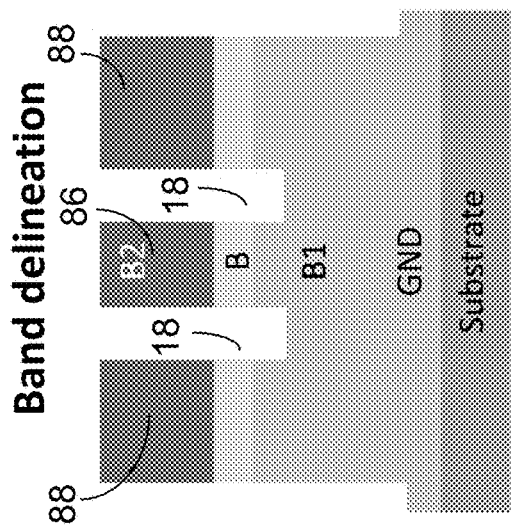
FIGS. 6A, 6B, 6C, 6D, 6E, 6F, 6G, 6H, 6I, 6J, 6K and 6L show a process flow for fabricating a dual-band image devices for 2 bump 2 color configuration in accordance with the present disclosure.

As shown in FIG. 3B, an np-pn back-to-back dual-band image sensor has a common ground 16, which may be on a substrate 24, as shown in FIG. 6A. The Band 1 diode layer, shown in FIG. 3B is a p-n diode with the n-type layer 30 on the common ground layer 16 and the p-type layer 32 on the n-type layer 30. A middle contact layer 34 is on the p-type layer 32. The Band 2 diode layer, shown in FIG. 3B is a p-n diode with the p-type layer 36 on the middle contact layer 34 and the n-type layer 38 on the p-type layer 36. As shown the ring 18 is formed by a removed portion of the Band 2 p-n diode 36, 38, the middle contact layer 34, and the p-type layer 36 and into, but not through the n-type layer 30. The contact or bump 14 is on the Band 2 n-type layer 38 outside of the ring 18, and is biased with a positive voltage. The contact or bump 12 is on the Band 2 n-type layer 38 inside of the ring 18, and is biased with a negative voltage.

As shown in FIG. 3C, a pn-np back-to-back dual-band image sensor has a common ground 16, which may be on a substrate 24, as shown in FIG. 6A. The Band 1 diode layer, shown in FIG. 3C is a p-n diode with the p-type layer 40 on the common ground layer 16 and the n-type layer 42 on the p-type layer 40. A middle contact layer 44 is on the n-type layer 42. The Band 2 diode layer, shown in FIG. 3C is a p-n diode with the n-type layer 46 on the middle contact layer 44 and the p-type layer 48 on the n-type layer 46. As shown the ring 18 is formed by a removed portion of the Band 2 p-n diode 48, 46, the middle contact layer 44, and the n-type layer 42 and into, but not through the p-type layer 40. The contact or bump 14 is on the Band 2 p-type layer 48 outside of the ring 18, and is biased with a negative voltage. The contact or bump 12 is on the Band 2 p-type layer 48 inside of the ring 18, and is biased with a positive voltage.

As shown in FIG. 3D, a n-barrier-n unipolar dual band image sensor has a common ground 16, which may be on a substrate 24, as shown in FIG. 6A. The Band 1 absorber layer, shown in FIG. 3D is an n-type layer 50 on the common ground layer 16. A barrier layer 52 is on the n-type layer 50. The Band 2 absorber layer, shown in FIG. 3D is an n-type layer 54 on the barrier layer 52. As shown the ring 18 is formed by a removed portion of the Band 2 n-type absorber 54, the barrier layer 52, and into, but not through the Band 1 n-type absorber layer 50. The contact or bump 14 is on the Band 2 n-type absorber layer 54 outside of the ring 18, and is biased with a positive voltage. The contact or bump 12 is on the Band 2 n-type absorber layer 54 inside of the ring 18, and is biased with a negative voltage.

As shown in FIG. 3E, a p-barrier-p unipolar dual band image sensor has a common ground 16, which may be on a substrate 24, as shown in FIG. 6A. The Band 1 absorber layer, shown in FIG. 3D is a p-type layer 60 on the common ground layer 16. A barrier layer 62 is on the p-type layer 60. The Band 2 absorber layer, shown in FIG. 3E is a p-type layer 64 on the barrier layer 62. As shown the ring 18 is formed by a removed portion of the Band 2 p-type absorber layer 64, the barrier layer 62, and into, but not through the Band 1 p-type absorber layer 60. The contact or bump 14 is on the Band 2 p-type absorber layer 64 outside of the ring 18, and is biased with a negative voltage. The contact or bump 12 is on the Band 2 p-type absorber layer 64 inside of the ring 18, and is biased with a positive voltage.

Figure 4:
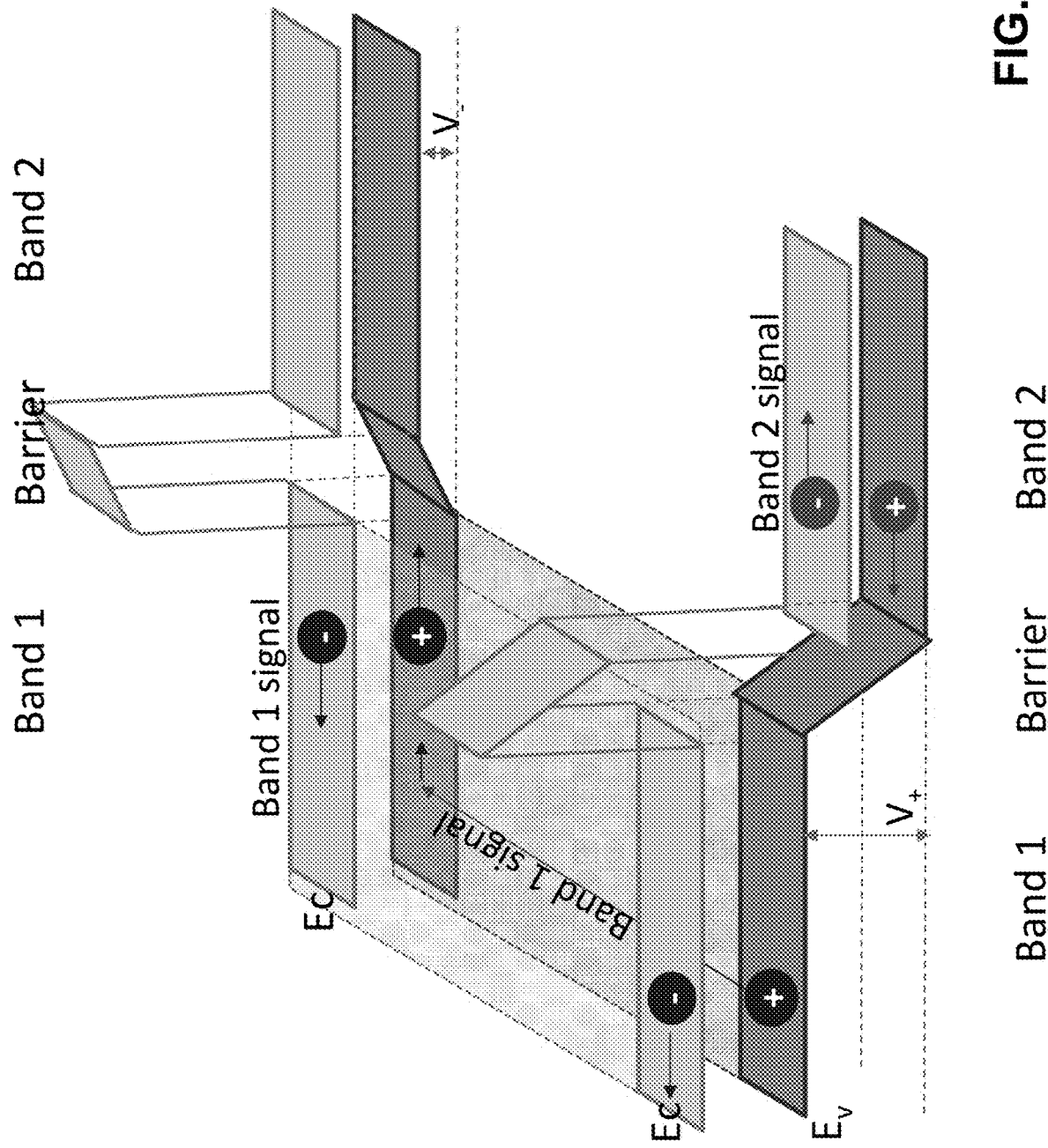
FIG. 4 shows a band structure diagram of the image sensor of FIG. 3A with the configuration shown in 3D, the n-Barrier-n unipolar dual-band image sensor configuration, illustrating and validating the working principle of simultaneous dual-band collection in accordance with the present disclosure.

FIG. 4 shows a band structure diagram of the image sensor of FIG. 3A with the configuration shown in 3D, the n-Barrier-n unipolar dual-band image sensor configuration, and illustrates and validates the working principle of simultaneous dual-band collection. The common ground is kept at electrical neutral ground, while the Band 1 bump is biased negatively and the Band 2 bump is bias positively. Photogenerated holes in Band 1 valence band, shown as blue circles in FIG. 4, can freely pass through the Band 1 barrier to reach to the contact, creating a Band 1 signal. Photogenerated holes in Band 2, shown as red circles in FIG. 4, also can freely pass through the Band 2 barrier to reach the common ground, generating a Band 2 signal. Both Band 1 and Band 2 can operate independently, and simultaneously, thus producing simultaneous two color image sensing.

The device can also be operated in sub-pixel mode, where Band 1 has one pixel while Band 2 has multiple sub-pixels with individual contact bumps. FIGS. 5A illustrates an example where 4 sub-pixels of Band 2 are co-located with one superpixel of Band 1. The 4 sub-pixels are identified as pixels 1, 2, 3, and 4, and are formed by separating the subpixels by etching between the pixels, as shown by removed material 70 in FIG. 5A. FIG. 5B shows a sectional side view through sub-pixels 1 and 4 of Band 2 and superpixel 5 of Band 1 for the unipolar architecture of FIG. 3D; however, the architectures of FIGS. 3B, 3C and 3E may also be used. The working principle is the same as illustrated in FIG. 4.

FIGS. 6A, 6B, 6C, 6D, 6E, 6F, 6G, 6H, 6I, 6J, 6K and 6L show a process flow for fabricating a dual-band image sensor for a 2 bump 2 color configuration. Alternating figures show a side view, such as FIG. 6A, and a corresponding top view, such as FIG. 6B, at each step. The process is illustrated for an n-Barrier-n unipolar dual band sensor, as illustrated in FIG. 3D, or a p-Barrier-p unipolar dual band sensor, as illustrated in FIG. 3E. The process for a np-pn back to back dual band sensor, as illustrated in FIG. 3B, or a pn-np back to back dual band sensor, as illustrated in FIG. 3C is similar, except that the as grown wafer in FIG. 6A needs to change to be in accordance with FIGS. 3B or 3C.

Figure 6C:
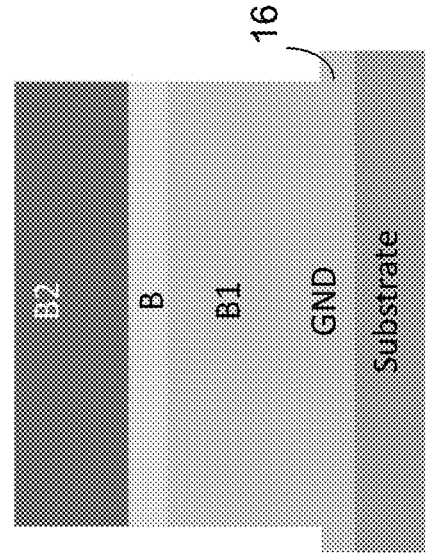
Figure 6E:
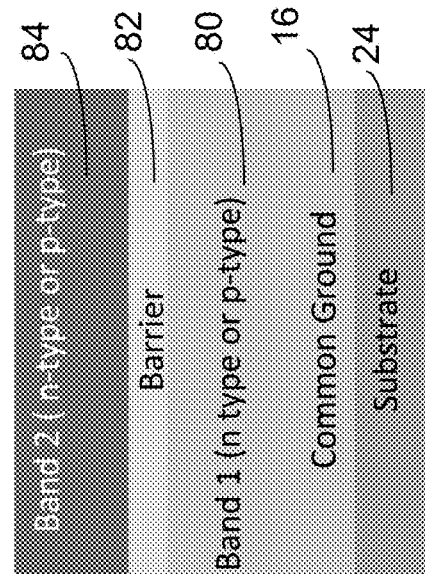
Figure 6B:
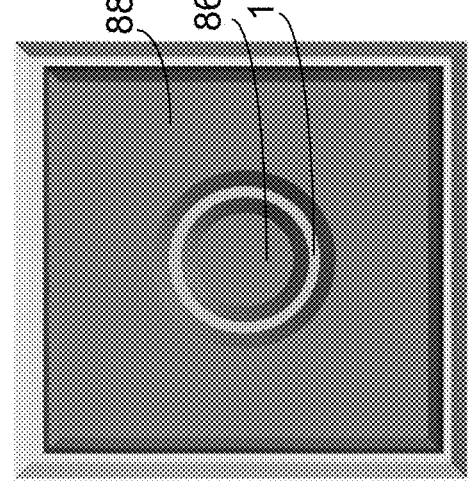

In the step shown in FIGS. 6A and 6B a wafer is grown with layers of one of the configurations of FIGS. 3B, 3C, 3D and 3E. FIGS. 6A and 6B show layers grown for the n-Barrier-n unipolar dual band sensor of FIG. 3D, or the p-Barrier-p unipolar dual band sensor of FIG. 3E. A common ground layer 16 is formed on a substrate 24. Then a Band 1 n-type layer or p-type absorber layer 80 is formed on the common ground layer 16. Then a barrier layer 82 is formed on the Band 1 layer. Then a Band 2 n-type layer or p-type absorber layer 84 is formed on the barrier layer 82. The as grown wafer of FIG. 6A may be large enough to accommodate many pixels.

Figure 6D:
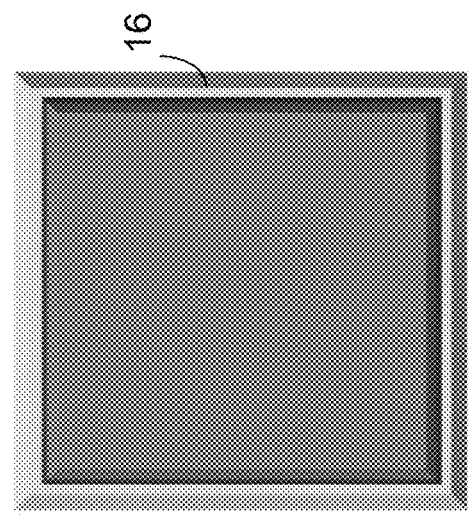

Then, as shown in FIG. 6C and 6D, reticulation of the as grown wafer is performed to separate the pixels on the as grown wafer. Pixel reticulation is performed by etching the sides of each pixel to the common ground layer 16, thereby separating each pixel while retaining the common ground layer 16 for each pixel.

Figure 6F:
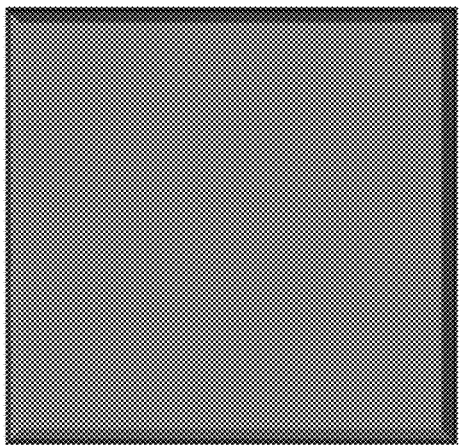

Next, a ring 18 is formed in the center of each pixel by etching a ring 18 through the Band 2 absorber layer 84, the barrier layer 82 and into but not through the Band 1 absorber layer 80 to create 2 regions of Band 2 absorber materials: a Band 2 region inside the ring 86 and a Band 2 region outside of the ring 88, as shown in FIGS. 6E and 6F.

Figure 6G:
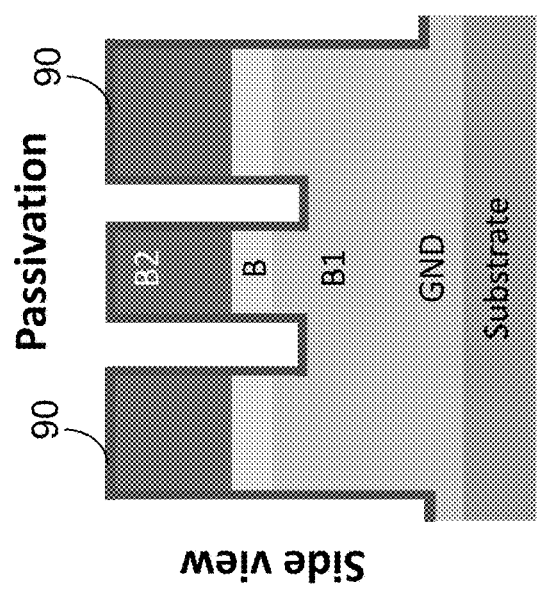
Figure 6I:
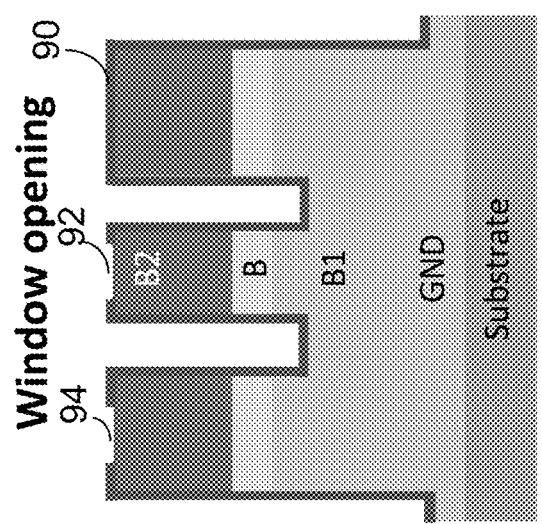
Figure 6K:
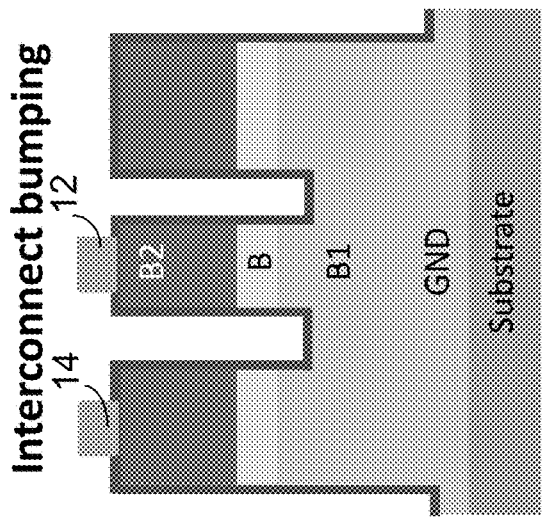
Figure 6H:
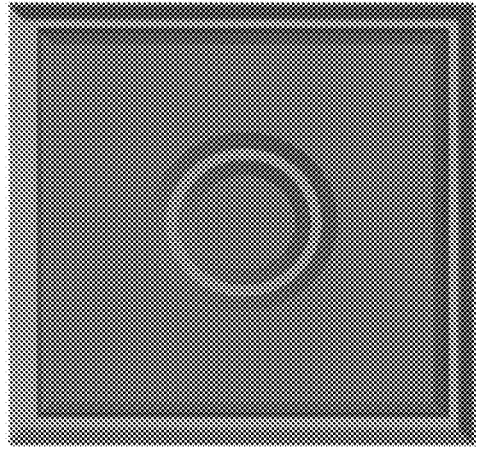
Figure 6J:
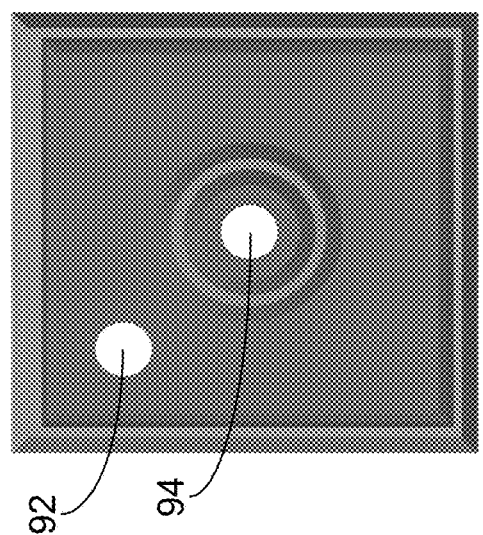
Figure 6L:
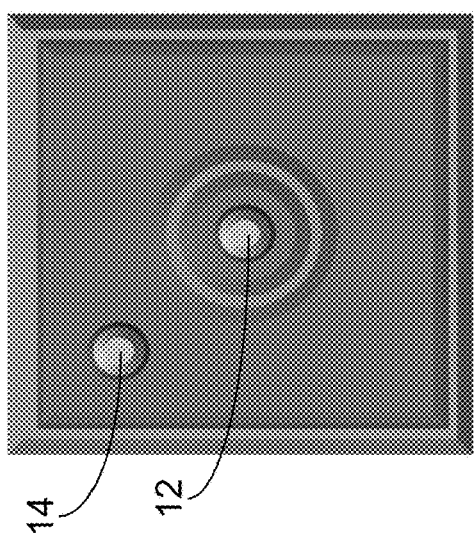

Then, a passivation layer 90 is deposited over the pixel, as shown in FIGS. 6G and 6H.

Next, a first opening 92 in the passivation layer 90 is formed to expose the Band 2 region inside the ring and a second opening 94 in the passivation layer 90 is formed to expose the Band 2 region outside the ring.

Then a first interconnect or contact 12, which may be a metal contact or an Indium bump, is formed in the first opening on the Band 2 region inside the ring for signal collection of Band 1. Also a second interconnect or contact 14, which may be a metal contact or an Indium bump, is formed in the second opening on the Band 2 region outside the ring for signal collection of Band 2. The first interconnect or contact for Band 1 collection is biased oppositely from the second interconnect or contact for Band 2 collection, as shown in FIGS. 3B, 3C, 3D and 3E. Band 1 and Band 2 may be simultaneously collected.

The process for fabricating the 5 bump image sensor as shown in FIGS. 5A and 5B is similar, and may include etching to remove the material 70, as shown in FIG. 5B to form the subpixels 1, 2, 3, 4 and 5 described above. It is expected that a person skilled in the art would understand how to fabricate a 5 bump image sensor as shown in FIGS. 5A and 5B for each of the configurations shown in FIGS. 3B, 3C, 3D and 3E.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of providing a simultaneous dual-band image sensor having a plurality of pixels comprising:
    providing a substrate;
    forming a common ground on the substrate;
    forming a Band 1 diode layer on the common ground layer;
    forming a middle contact layer on the Band 1 diode layer;
    forming a Band 2 diode layer on the middle contact layer;
    reticulating each pixel by etching the Band 2 diode layer, the middle contact layer and the Band 1 diode layer on sides of each pixel to but not through the common ground layer;
    etching a ring through the Band 2 diode layer, and the middle contact layer and into the Band 1 diode layer but not through the Band 1 diode layer;
    forming a first contact on a portion of the Band 2 diode layer inside the ring; and
    forming a second contact on a portion of the Band 2 diode layer outside the ring;
    wherein the Band 1 diode layer comprises a first n--type layer on the common ground layer and a first p-type layer on the first n-type layer, the Band 2 diode layer comprises a second p-type layer on the middle contact layer and a second n-type layer on the second p-type layer, and wherein forming a first contact on a portion of the Band 2 diode layer inside the ring and forming a second contact on a portion of the Band 2 diode layer outside the ring comprises forming the first contact and the second contact on the second n-type layer; or
    wherein the Band 1 diode layer comprises a first p-type layer on the common ground layer and a first n-type layer on the first p-type layer, the Band 2 diode layer comprises a second n-type layer on the middle contact layer and a second p-type layer on the second n--type layer, and wherein forming a first contact on a portion of the Band 2 diode layer inside the ring and forming a second contact on a portion of the Band 2 diode layer outside the ring comprises forming the first contact and the second contact on the second p-type layer.

2. The method of claim 1 further comprising: applying a first bias voltage to the first contact; and applying a second bias voltage to the second contact; wherein the first bias voltage is opposite in polarity to the second bias voltage.

3. The method of claim 1 wherein forming a first contact on a portion of the Band 2 diode layer inside the ring and forming a second contact on a portion of the Band 2 diode layer outside the ring comprises: depositing a passivation layer; forming openings in the passivation layer; and depositing contact material.

4. The method of claim 1: wherein the first contact and the second contact comprise a bump.

5. The method of claim 1: wherein the ring has a circular, rectangular or polygonal shape.

6. The method of claim 1 wherein etching a ring through the Band 2 diode layer, and the middle contact layer and into the Band 1 diode layer but not through the Band 1 diode layer further comprises: etching outside of the ring portions of the Band 2 diode layer, portions of the middle contact layer and portions of the Band 1 diode layer but not through the Band 1 diode layer to form a plurality of subpixels outside of the ring; and forming a respective contact on each respective subpixel of the plurality of subpixels.

7. A simultaneous dual-band image sensor having a plurality of pixels comprising: a substrate; a common ground on the substrate; wherein each pixel comprises: a Band 1 diode layer on the common ground layer; a middle contact layer on the Band 1 diode layer; a Band 2 diode layer on the middle contact layer; a ring opening in the pixel formed by a removed portion of the Band 2 diode layer, a removed portion of the middle contact layer and a removed portion of the Band 1 diode layer, wherein the ring opening does not extend through the Band 1 diode layer; a first contact on a portion of the Band 2 diode layer inside the ring; and a second contact on a portion of the Band 2 diode layer outside the ring; wherein the Band 1 diode layer comprises a first n-type layer on the common ground layer and a first p-type layer on the first n-type layer, the Band 2 diode layer comprises a second p-type layer on the middle contact layer and a second n-type layer on the second p-type layer, and wherein the first contact and the second contact are on the second n-type layer; or wherein the Band 1 diode layer comprises a first p-type layer on the common ground layer and a first n-type layer on the first p-type layer, the Band 2 diode layer comprises a second n-type layer on the middle contact layer and a second p-type layer on the second n-type layer, and wherein the first contact and the second contact are on the second p-type layer.

8. The simultaneous dual-band image sensor of claim 7 further comprising: the first contact having a first bias voltage; and the second contact having a second bias voltage; wherein the first bias voltage is opposite in polarity to the second bias voltage.

9. The simultaneous dual-band image sensor of claim 7: wherein the first contact and the second contact comprise a bump.

10. The simultaneous dual-band image sensor of claim 7: wherein the ring has a circular, rectangular or polygonal shape.

11. The simultaneous dual-band image sensor of claim 7 further comprising: a plurality of subpixels outside of the ring formed by removing portions of the Band 2 diode layer, portions of the middle contact layer and portions of the Band 1 diode layer, but not through the Band 1 diode layer; and a respective contact on each respective subpixel of the plurality of subpixels.

* * * * *